United States Patent [19]

Hamley

[11] Patent Number: 5,216,379
[45] Date of Patent: Jun. 1, 1993

[54] DYNAMIC BIAS AMPLIFIER

[76] Inventor: James P. Hamley, 2922 Cottonwood Dr., SE., Mill Creek, Wash. 98012

[21] Appl. No.: 904,839

[22] Filed: Jun. 26, 1992

[51] Int. Cl.$^5$ .............................................. H03G 3/30
[52] U.S. Cl. .................... 330/134; 330/136; 330/267; 330/279; 330/297
[58] Field of Search .............. 330/134, 136, 267, 273, 330/279, 296, 297; 381/96, 107, 108, 109, 120, 121

[56] References Cited

U.S. PATENT DOCUMENTS

| | | | |
|---|---|---|---|
| 4,077,013 | 2/1978 | Morez et al. | 330/296 X |
| 4,358,739 | 11/1982 | Nelson | 330/255 |
| 4,439,743 | 3/1984 | Schwarz et al. | 330/267 |
| 4,498,057 | 2/1985 | Noro | 330/297 |
| 4,502,020 | 2/1985 | Nelson et al. | 330/265 |
| 4,549,147 | 10/1985 | Kondo | 330/267 X |
| 4,638,260 | 1/1987 | Hamley | 330/254 |
| 4,752,745 | 6/1988 | Pass | 330/265 |

FOREIGN PATENT DOCUMENTS 5250654 4/1977 Japan.

OTHER PUBLICATIONS

*Stereo Review*, "Digital Pure-A—New possibilities for class-A," Dec. 1989.

*Primary Examiner*—James B. Mullins
*Attorney, Agent, or Firm*—James P. Hamley

[57] ABSTRACT

The bias level of an amplifier is controlled by an active bias circuit. The active bias circuit establishes a predetermined amplifier bias level (such as class A mode) as a function of input signal level and load impedance. The load impedance value may be manually entered or determined automatically by a disclosed impedance measuring system. Power supply circuitry is responsive to the value of load impedance to vary the bias voltage applied to the amplifier's output devices.

20 Claims, 10 Drawing Sheets

DYNAMIC BIAS AMPLIFIER

BACKGROUND OF THE INVENTION

The present invention relates to the electronic amplifier art and, in particular, to an amplifier which includes means to vary the amplifier's bias level as a function of input signal level and load impedance.

A critical link in modern high fidelity reproduction systems is the audio amplifier. In a typical installation, the audio amplifier connects between a signal source, such as the output from a compact disc player, and the loudspeaker. The amplifier both voltage and power multiplies the input signal in order to drive the loudspeaker to a satisfactory level.

It has been found that listeners can discern various forms of amplifier distortion which, although a small percentage of the reproduced signal, nonetheless constitutes a fatigue inducing irritation. One source of such distortion is clipping induced by input signal levels which drive the amplifier beyond its linear drive region and into saturation of the output power devices. A common approach to combat clipping is to provide very high power amplifiers which are capable of large signal excursions before the output devices are driven to saturation. Such high power amplifiers are expensive to manufacture due to the high cost of high voltage, high power semiconductors and the need for expensive power supply components.

To minimize the internal heating of output devices in high power amplifiers, the output devices are commonly operated in a class AB mode. A necessary limitation of class AB operation is the production of crossover or notch distortion as symmetrical push-pull devices make the transition between conducting states. While such notch distortions may be a small percentage of the total signal supplied by the amplifier, it is nonetheless objectionable and fatiguing to listeners. From the listener's standpoint, class A amplifier operation is much preferred in that the above-described cross-over distortion is eliminated. However, class A mode operation results in unacceptably high power dissipation in the output power devices, thereby requiring many such devices with large attendant heat sinks, fans, and so forth.

Thus, there has been a long felt need in the audio amplifier art for an amplifier design that exhibits class A sound quality with class AB device dissipation.

On such solution known to the prior art is described in U.S. Pat. No. 4,638,260 which issued Jan. 20, 1987 and is assigned to the same inventor as the present application. Described therein is a bias control circuit which combines a static bias signal with a dynamic bias signal to produce a resultant bias signal which, when coupled through an optical-coupler, dynamically biases an otherwise AB amplifier into a class A amplifier under dynamic signal conditions.

While the above-referenced invention defines a distinct advance in the audio amplifier art, it does not take into account variations in the impedance of the load. The impedance of a loudspeaker is specified by its manufacturer, with common values being 2, 4, 6 or 8 ohms. These stated impedance values are nominal, and as a practical matter in a given loudspeaker design the impedance can vary considerably as a function of frequency. For example, it is not uncommon to find that a loudspeaker which is rated at a nominal 8 ohm impedance exhibits 40 ohms or more at its resonance point. Since power equals the square of current times resistance, an amplifier must develop 1 amp into an 8 ohm load to produce 8 watts of power. On the other hand, the same amplifier must deliver 2 amps of current into a 2 ohm load in order to produce 8 watts of power. In order to assure class A mode operation of the output power devices, they must always pass slightly more current than required by the load to thereby assure that the devices never shut off. In the example above, the output devices need only be biased at a current greater than 1 amp when driving an 8 ohm load to produce 8 watts or less of class A operation, whereas into a 2 ohm load they must pass a current greater than 2 amps.

In addition, since power equals the square of voltage divided by resistance, the voltage swing of the output devices in the power amplifier must develop twice the voltage into an 8 ohm load to create the same power level as into a 2 ohm load. This means that if an amplifier is rated to deliver a given power into either 2 or 8 ohms, the power supply must provide sufficient bias voltage on the amplifier's output devices to accommodate the 8 ohm rating-even though a 2 ohm load would require only half that bias voltage to produce the amplifier's rated power. Since power dissipated in the output devices equals current times voltage, it would be desirable to reduce output device bias voltage in the event the amplifier drives a low impedance load.

SUMMARY OF THE INVENTION

The present invention, therefore, is directed to an improved audio amplifier design which is capable of dynamically biasing the amplifier as a function of both signal level and load impedance.

Briefly, according to the invention, an amplifier comprises an input adapted to receive an input signal, an output adapted to be coupled to a load, and amplifying means for amplifying an input signal received at the input and coupling the amplified input signal to the output. The amplifier further comprises bias control means which includes an input signal responsive means for producing a first control signal which is predeterminedly related to a received input signal. An impedance responsive means produces a second control signal predeterminedly related to the impedance of the load. A further provided control means is responsive to the first and second control signals for predeterminedly controlling the bias level of the amplifier.

In a further aspect of the invention, the input signal responsive means comprises a peak detector for producing a first control signal responsive to the peak value of the input signal.

In a further aspect of the invention, the impedance responsive means comprises a means for manually entering an input corresponding to the impedance of the load and a means for producing said second control signal responsive to the manually entered input.

In a further aspect of the invention, the impedance responsive means includes automatic test means for automatically producing the signal corresponding to the impedance of the load and a means for producing the second control single responsive to the automatic test means produced signal.

In a yet further aspect of the invention, the impedance responsive means includes selector means for manually entering one of: (i) an input corresponding to the impedance of a load, or (ii) an input commanding an automatic test of the impedance of the load, automatic test means responsive to an input commanding an automatic test of the impedance of the load for producing a signal corresponding to the impedance thereof, and means for producing the second control signal responsive to the selector means selected one of: (i) the input corresponding to the impedance of the load, or (ii) the automatic test means produced signal.

In a further aspect of the invention, the amplifier includes a power supply which predeterminedly varies the voltage bias on the amplifier's output devices in response to the impedance of the load.

DETAILED DESCRIPTION

Figure 1:
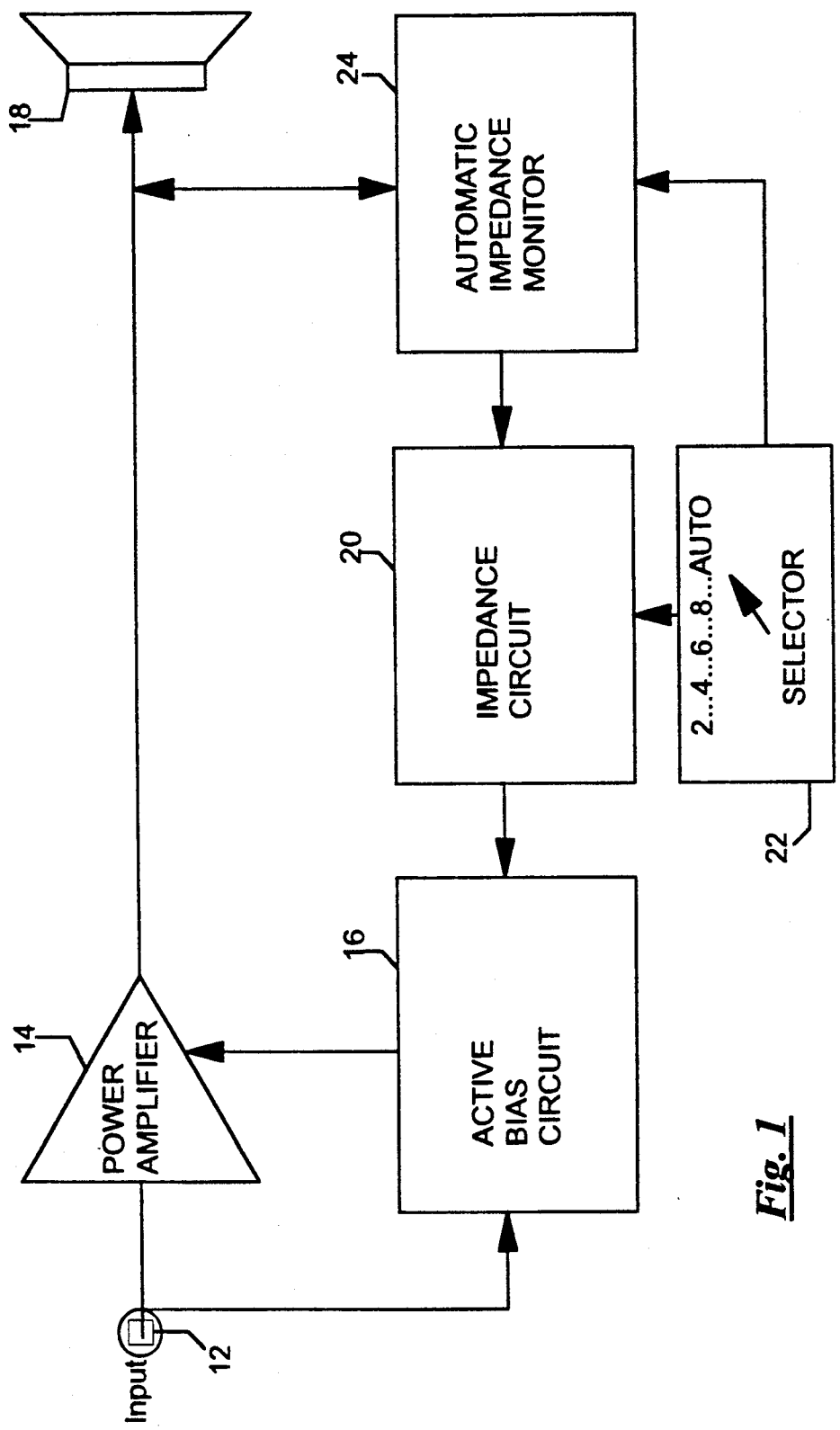
FIG. 1 is a block diagram illustrating the principle components of the input level and load impedance responsive dynamic bias amplifier according to the preferred embodiment of the invention.

FIG. 1 is a block diagram illustrating the principle blocks of a system according to the preferred embodiment of the invention. Here, a signal to be amplified, such as the output from a compact disc player, is passed to an input terminal 12. The input terminal 12 is coupled to the input of the power amplifier 14 and the input of an active bias circuit block 16. The power amplifier block 14, in the normal manner, power amplifies the signal received at the input terminal 12 and applies it to a loudspeaker 18.

In this, the preferred embodiment of the invention, the active bias circuit 16 is designed to maintain bias in the power amplifier 14 such that it operates in a dynamic class A mode of operation. Thus, the active bias circuit 16 appropriately increases the bias level of the output stages of the power amplifier 14 as the level of the signal applied to the input 12 increases. The increase in bias current in the output devices of the power amplifier 14 is designed to assure that the output devices are always biased at a dynamic current slightly higher than the current which must be sourced to, or sunk from the loudspeaker 18.

Since the magnitude of current which must be source to, or sunk from the loudspeaker 18 is a function of the impedance of the loudspeaker 18, the preferred embodiment of the present invention includes an impedance controller block 20. Coupled to the impedance controller block 20 are a selector block 22 and an automatic impedance monitor block 24. As is more fully described herein below, the impedance controller block 20 produces a control output signal which, when processed by the active bias circuit 16, varies the level of the power amplifier 14 bias current as a function of the impedance of the loudspeaker 18, thereby assuring the desired class of amplifier operation independent of variations in loudspeaker load 18 impedance.

The value of the impedance of the loudspeaker 18 may be input in one of two ways. If the user desires to program the impedance controller 20 to a desired nominal impedance, this can be selected by the selector 22. The options, as shown, in selector 22 include 2, 4, 6 and 8 ohms.

If, however, the user desires to allow automatic circuitry to determine the impedance of the loudspeaker 18, the selector is positioned in the "AUTO" input mode, thereby activating the automatic impedance monitor 24. In a manner described more fully herein below, the automatic impedance monitor block 24 uses a test signal to actually measure the impedance of the loudspeaker 18. This measured impedance is then converted into one of the manual options, i.e., 2, 4, 6 or 8 ohms, through the impedance controller 20 and provided as a control signal to the active bias block 16.

Figure 2:
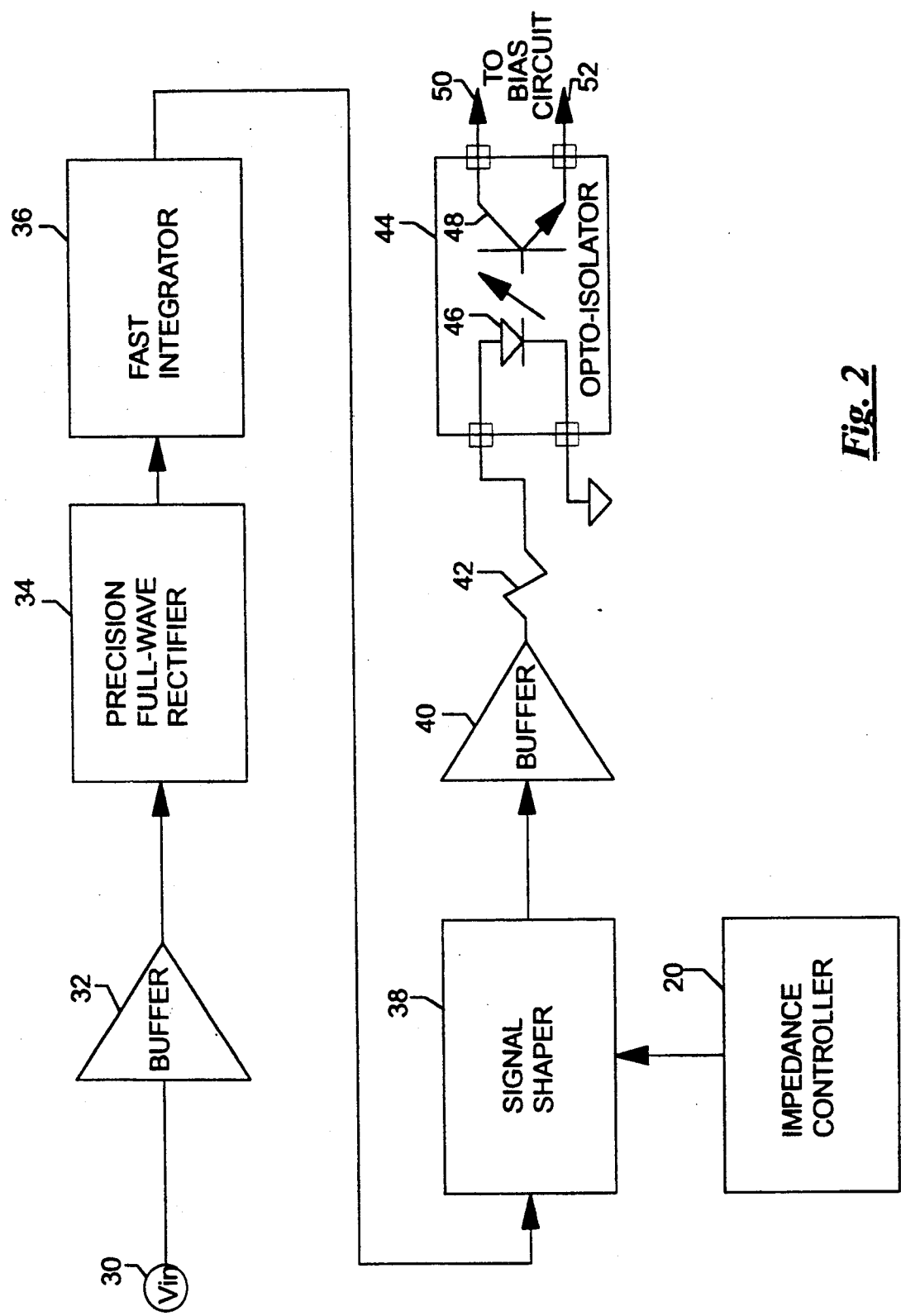
FIG. 2 is a block diagram illustrating the principle components of the active bias circuit block as depicted in FIG. 1.

FIG. 2 is a block diagram illustrating the principle systems contained within the active bias circuits 16 of FIG. 1. Here, the input signal is coupled to the input terminal 30 and passed to the input of a buffer amplifier 32. The output from buffer amplifier 32 is passed to a precision full-wave rectifier block 34. The output from precision full-wave rectifier block 34 is passed to a fast integrator block 36, whose output is passed to a signal shaper block 38. An additional input to the signal shaper block 38 is the output from the impedance controller 20.

The output from signal shaper block 38 is buffered via a buffer amplifier 40 and coupled through a predetermined resistor 42 to an opto-isolator 44. The opto-isolator 44, in the conventional manner, includes an input light emitting diode 46 and an output photo transistor 48. The collector 50 and emitter 52 terminals from the photo transistor 48 couple to the bias circuit of the amplifier, as is described more fully herein below.

Operation of the system illustrated in FIG. 2 is understood as follows. An input signal, after being buffered through buffer amplifier 32, is full-wave rectified in the precision full-wave rectifier block 34. The resultant rectified signal out of precision full-wave rectifier block 34 is integrated to a DC value in the fast integrator block 36. The DC signal at the output of fast integrator block 36 thereby represents the level of the input signal being amplified in the power amplifier.

This DC signal is appropriately signal shaped by a signal shaper block 38, to produce a signal which, when buffered through a buffer amplifier 40 and coupled through a predetermined resistor 42, produces a defined current through the light emitting diode 46 of opto-isolator 44. The defined current through light emitting diode 46 causes it to emit light at a level which biases photo-transistor 48 to a level suitable such that the bias level of the associated power amplifier is varied to established a dynamic class A mode of operation.

The output control signal from single shaper block 38 also varies as a function of the impedance of the amplifier load, as determined by the impedance controller block 20. Thus, bias level of the power amplifier is varied both as a function of input signal level and as a function of the impedance of the amplifier's load.

Figure 3:
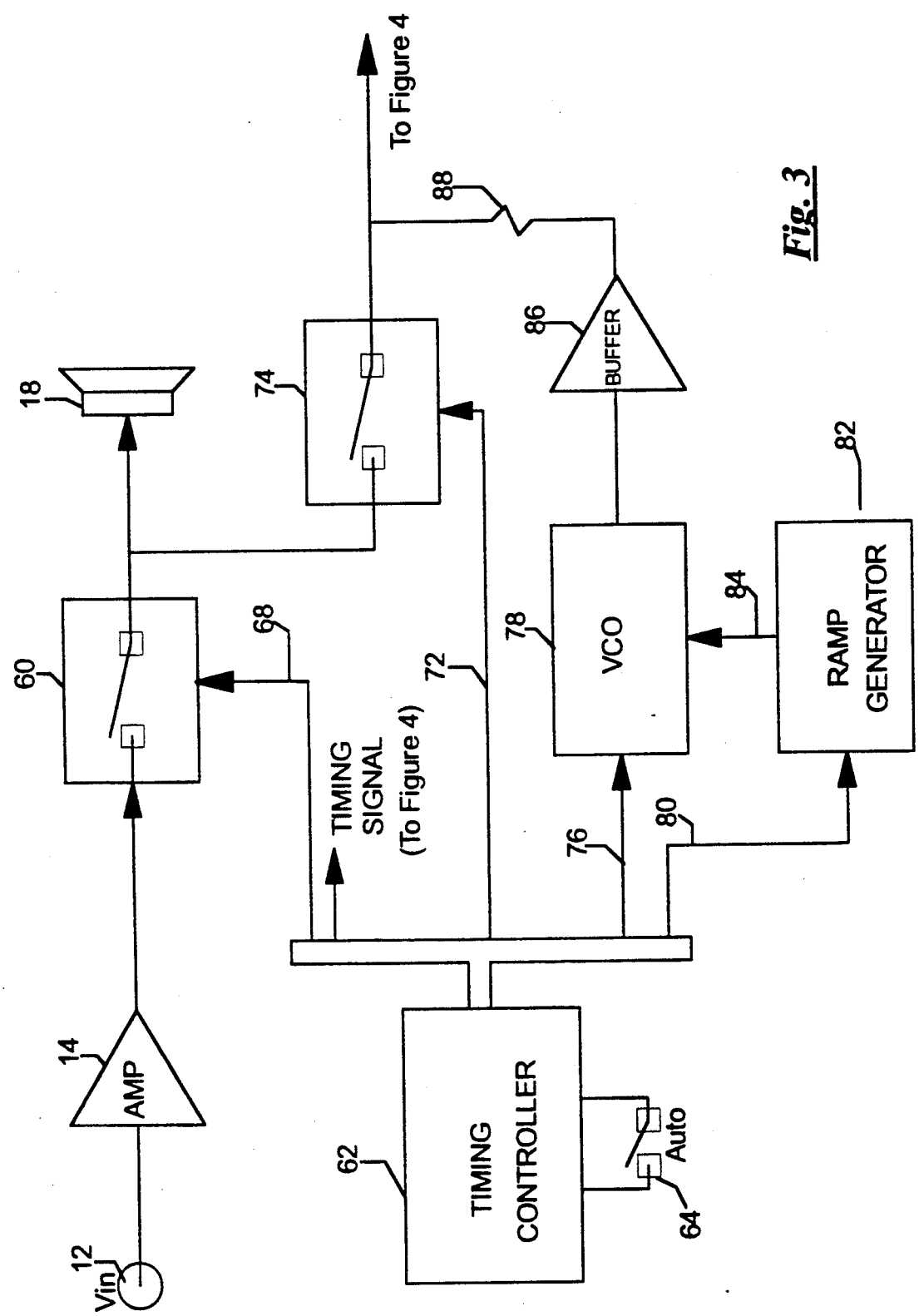
FIGS. 3 and 4 are detailed block diagrams illustrating the principle components of the impedance controller, selector and automatic impedance monitor block as depicted in FIG. 1.
Figure 4:
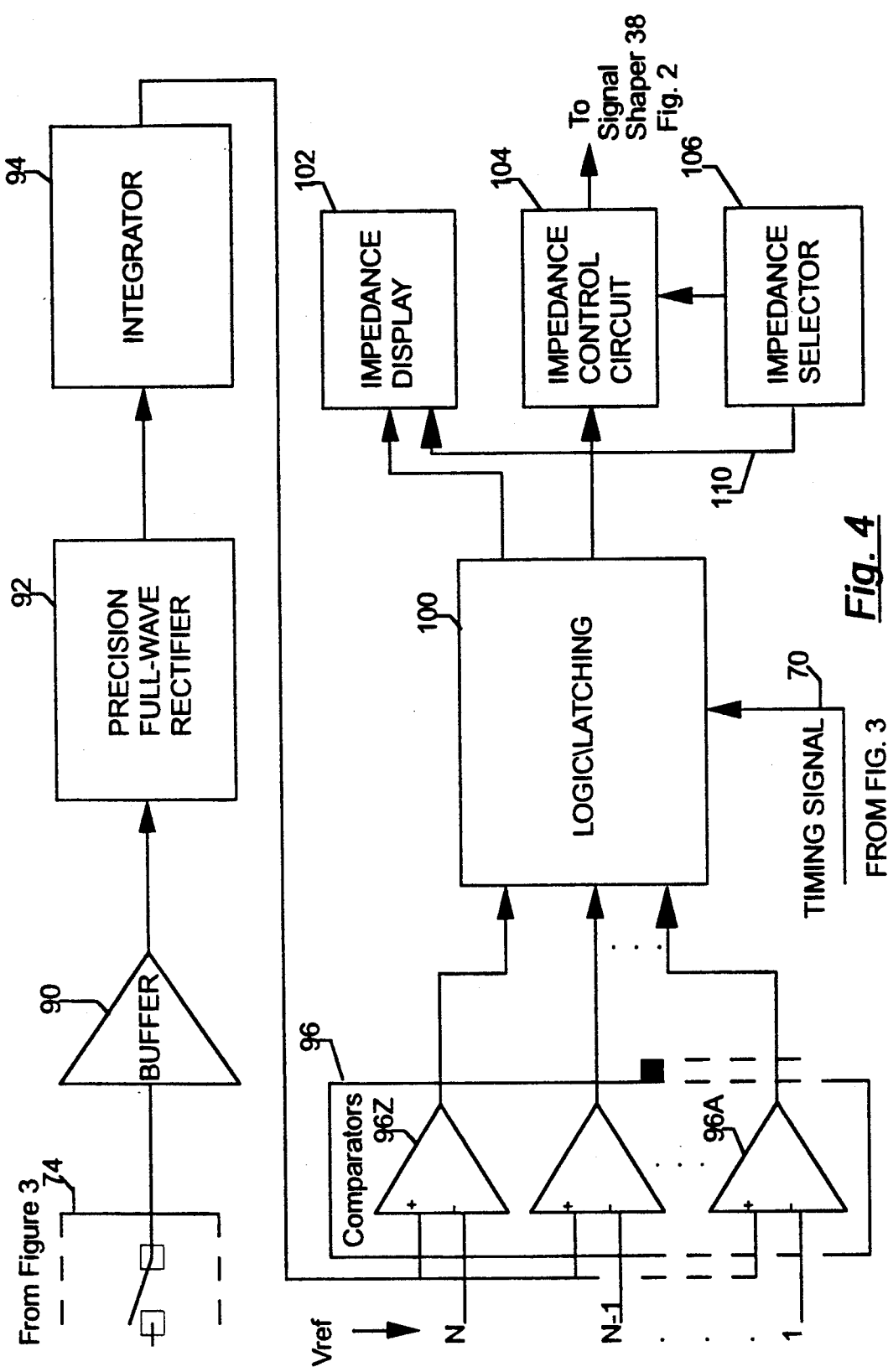

FIGS. 3 and 4 are detailed block diagrams depicting the principle blocks of the impedance controller 20, selector 22 and automatic impedance monitor 24 as shown in FIG. 1.

Referring to FIG. 3, the input signal to the amplifier is coupled to an input terminal 12 and thence to the amplifier 14. The output from the amplifier 14 passes through a relay 60 to the loudspeaker 18. As will be understood from the description below, relay 60 is closed during normal operation of the amplifier, but opened when the automatic impedance determining circuitry is in operation to measure the impedance of the loudspeaker 18.

Operation of the impedance determining circuit is initiated by commands from a timing controller block 62. The timing controller block 62 is designed to initiate an impedance measure of the loudspeaker 18 when either the selector (identified as block 22 in FIG. 1, here shown as switch 64) is either manually turned to the "AUTO" mode while the amplifier is in operation or if the amplifier is in the "AUTO" mode when power to the amplifier is first turned on.

Once initiated, the timing controller 62 produces timing control signals on its output bus 66. One output control signal passes from the bus 66 over a line 68 to the relay 60, to thereby open relay 60 and disconnect the amplifier 14 from the loudspeaker 18. A second output from the bus 66 is carried over line 70 as a timing signal to the impedance logic circuitry as shown in FIG. 4. A third timing signal is carried from bus 66 over line 72 to a second relay 74 which closes, thereby connecting the impedance measuring circuitry to the loudspeaker 18.

A fourth timing signal is coupled from the bus 66 over a line 76 to a voltage controlled oscillator 78.

A further output line 80 from the bus 66 couples to a ramp generator block 82. The output from ramp generator block 82 couples over a line 84 to the input of the voltage controlled oscillator 78. The output signal from the voltage controlled oscillator 78 couples through a buffer amplifier 86 and through a predetermined resistor 88 through the relay 74 to the loudspeaker 18.

Operation of the circuitry in FIG. 3 is understood as follows. When the timing controller block 62 is triggered, as by the "AUTO" selector switch 64, an array of timing signals are produced on the output bus 66. The timing signal on output line 68 activates relay 60 to its open position, thereby disconnecting the amplifier 14 from the loudspeaker 18. The timing signal over line 72 activates relay 74 to its closed position, thereby connecting the impedance determining circuitry to the loudspeaker 18.

The output over timing line 80 triggers ramp generator block 82 to produce a predetermined ramp signal. This ramp signal is coupled over line 84 and causes a sinusoidal output signal from oscillator 78 to sweep at a predetermined rate over a predetermined range of frequencies.

The swept frequency range is selected to sweep over those frequencies known to include the impedance peaks of a given loudspeaker 18. For example, in one preferred embodiment of the invention, the ramp generator 82 and voltage controlled oscillator 78 were designed to create a three-volt peak-to-peak constant-voltage sine wave which was swept from 10 Hertz to 200 Hertz.

The swept frequency test signal out of the voltage controlled amplifier 78 is buffered by the buffer amplifier 86 before being coupled to the predetermined value resistor 88 and relay 74 to the loudspeaker 18. The predetermined value resistor 88 is included for the following reason. Impedance is equal to voltage divided by current. If the load under test, such as loudspeaker 18, is fed from a constant current source, then the voltage developed across the load will be directly proportional to the load impedance. Thus, predetermined value resistor 88 is selected to be significantly greater than the highest impedance anticipated from the load, such as loudspeaker 18. In one embodiment of the invention, the predetermined value resistor 88 was selected as 1,000 ohms, thereby assuring a constant current test signal into a typical loudspeaker 18.

Turning now to FIG. 4, the voltage as produced across the loudspeaker 18 is coupled through the relay 74 and through a buffer amplifier 90 to a precision full-wave rectifier block 92. Precision full-wave rectifier block 92 acts to full-wave rectify the sinusoidal voltage signal which the constant current test signal produces in the loudspeaker 18. This precision full-wave rectified signal from block 92 is integrated to a DC value in integrator block 94. Since the voltage produced by the constant current test signal into the loudspeaker 18 is directly proportional to the impedance of the loudspeaker 18, the level of the DC signal out of integrator 94 represents the measured value of the impedance of the loudspeaker 18.

The DC signal from the integrator block 94 is passed to the positive inputs of a bank of comparators 96. Applied to the negative input of each comparator in the bank of comparators 96 is a unique reference voltage Vref. These reference levels are selected to correspond to the voltages produced out of the integrator 94 for various impedance levels of loudspeaker 18. Thus, for example, the voltage reference into the lowest level comparator 96A could correspond to that voltage produced out of integrator 94 when a 2 ohm resistor is substituted for loudspeaker 18. If the particular impedance measuring system is designed to measure loudspeakers having impedances as high as 8 ohms, the last comparator 96Z would be designed with an input reference voltage Vref N which is equal to the voltage produced out of integrator 94 when an 8 ohm resistor is substituted in place of loudspeaker 18. Thus, depending upon the impedance of the loudspeaker being tested, one or more of the comparators 96A . . . 96Z in the bank of comparators 96 will assume a high output state.

The outputs from the bank of comparators 96 are connected to the inputs of a logic/latching block 100. Also coupled as an input to logic/latching block 100 is the timing signal from the timing controller 62 passed over the line 70.

The output from the logic/latching block 100 connects to an impedance display 102 and an impedance control circuit block 104. An impedance selector block 106 (corresponding to the selector 22 of FIG. 1) is an additional input to the impedance control circuit block 104. The output from the impedance control circuit block 104 passes over a line 108 to the signal shaper block 38 of FIG. 2 to thereby vary the bias of the power amplifier as a function of the loudspeaker 18 impedance.

The logic/latching block 100 receives a timing signal over line 70 from the timing controller 62 indicating that the test signal applied to the loudspeaker has swept to its final frequency value. At this point, the status of the outputs from the bank of comparators 96 reflects the detected impedance of the loudspeaker 18. This detected impedance value is routed to a front panel impedance display 102 to display to the user the detected speaker impedance. If, however, the impedance selector 106 had been set to a user-selected value, a control signal from the impedance selector 106 is routed over line 110 to the impedance display 102, thereby producing a front panel display of the user selected impedance value.

The impedance control circuit block 104 responds to either a user selected impedance value from the impedance selector block 106 or from the automatic impedance measuring circuitry, out of logic/latching circuit 100 to apply an appropriate control signal to the signal shaper (block 38 of FIG. 2) to produce an appropriate amplifier bias level to maintain a desired amplifier class of operation for the impedance of the loudspeaker 18 or other load.

Figures 5A, 5B:
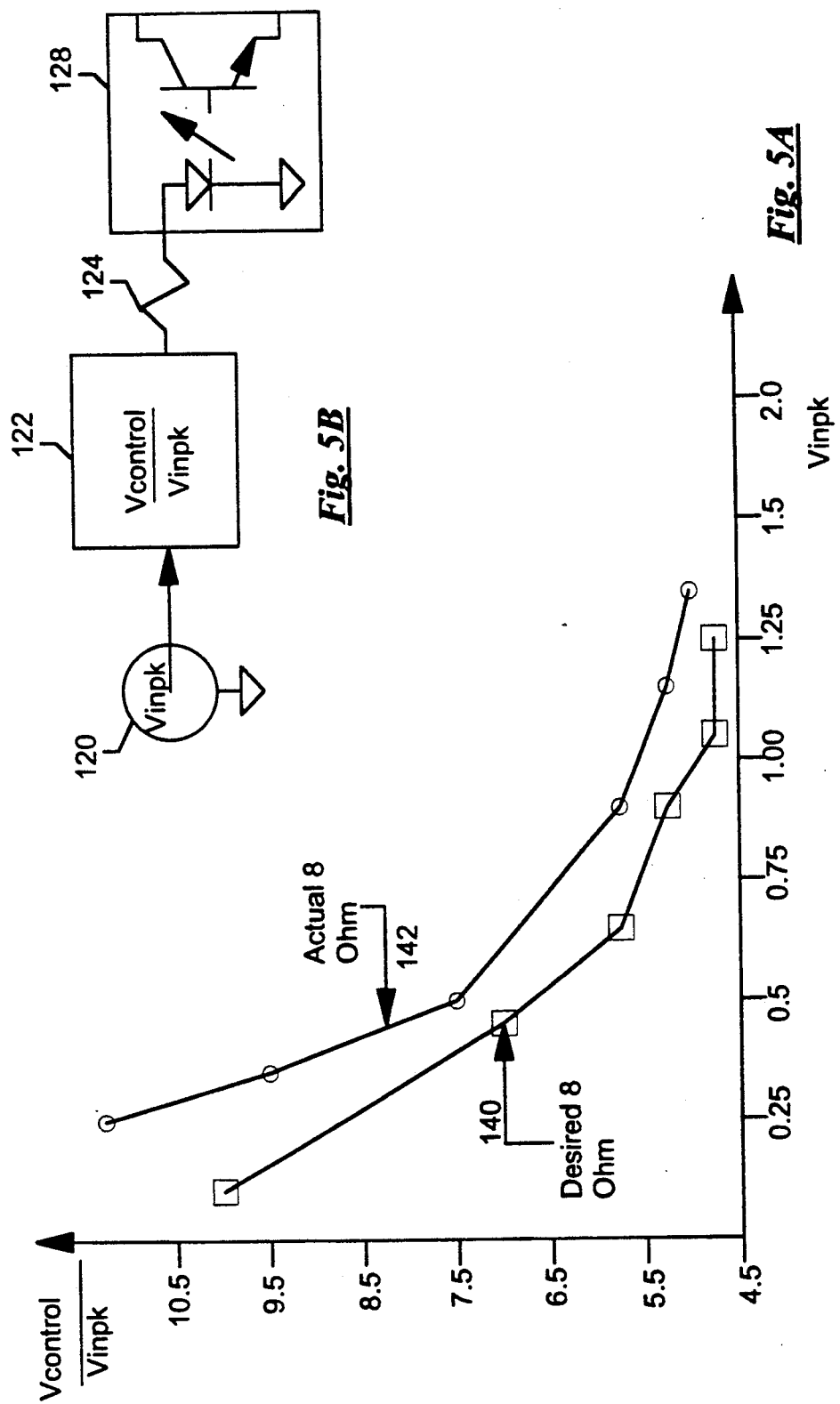
FIG. 5A is a graph depicting the calculated desired and actual control bias required in a given amplifier design to maintain a dynamic class A mode of operation.
FIG. 5B is a block diagram of a circuit illustrating the manner by which the graph of FIG. 5A was created.

FIG. 5A is a graph illustrating the manner by which the transfer characteristic of the signal shaper block 38 was developed for the preferred embodiment of the invention. The graph plots on its Y-axis a ratio of (Vcontrol/Vinpk) versus peak input signal Vinpk on the X-axis. The circuit shown in FIG. 5B illustrates the manner by which the graph of FIG. 5A was created. Shown is an audio signal source 120 which produces an input sine wave Vinpk. This signal is passed through a transfer block 122 having a control transfer Vcontrol/Vinpk. The output from the block connects through a predetermined value resistor 124 to the light emitting diode 126 input of an opto-isolator 128. Light emitted from the light emitting diode 126 is coupled to the base of the output NPN transistor 130 which, in turn, couples to the amplifier bias circuit. (Note that the resistor 124 corresponds to the resistor 42 of FIG. 2 and the opto-isolator 128 corresponds to the opto-isolator 44 FIG. 2.) Since block 122 has a transfer characteristic equal to Vcontrol/Vinpk and the input signal to the block has a value Vinpk, then the output from block 122 has a value Vcontrol. Using a DC power supply, the requisite value of Vcontrol required to produce a given amplifier bias current for different load impedances and different signal levels can easily be determined. Thus, the transfer characteristic Vcontrol/Vinpk required to produce a given amplifier bias current level as a function of input signal level can similarly be determined. Graph 140 of FIG. 5A depicts the desired transfer characteristic for an 8 ohm load. As is discussed more fully herein below, the actual embodiment of the signal shaper circuit (see FIG. 7) exhibits a transfer characteristic corresponding to graph 142, thereby establishing that the signal shaper will maintain class A amplifier operation for any given input signal level.

Figure 6A:
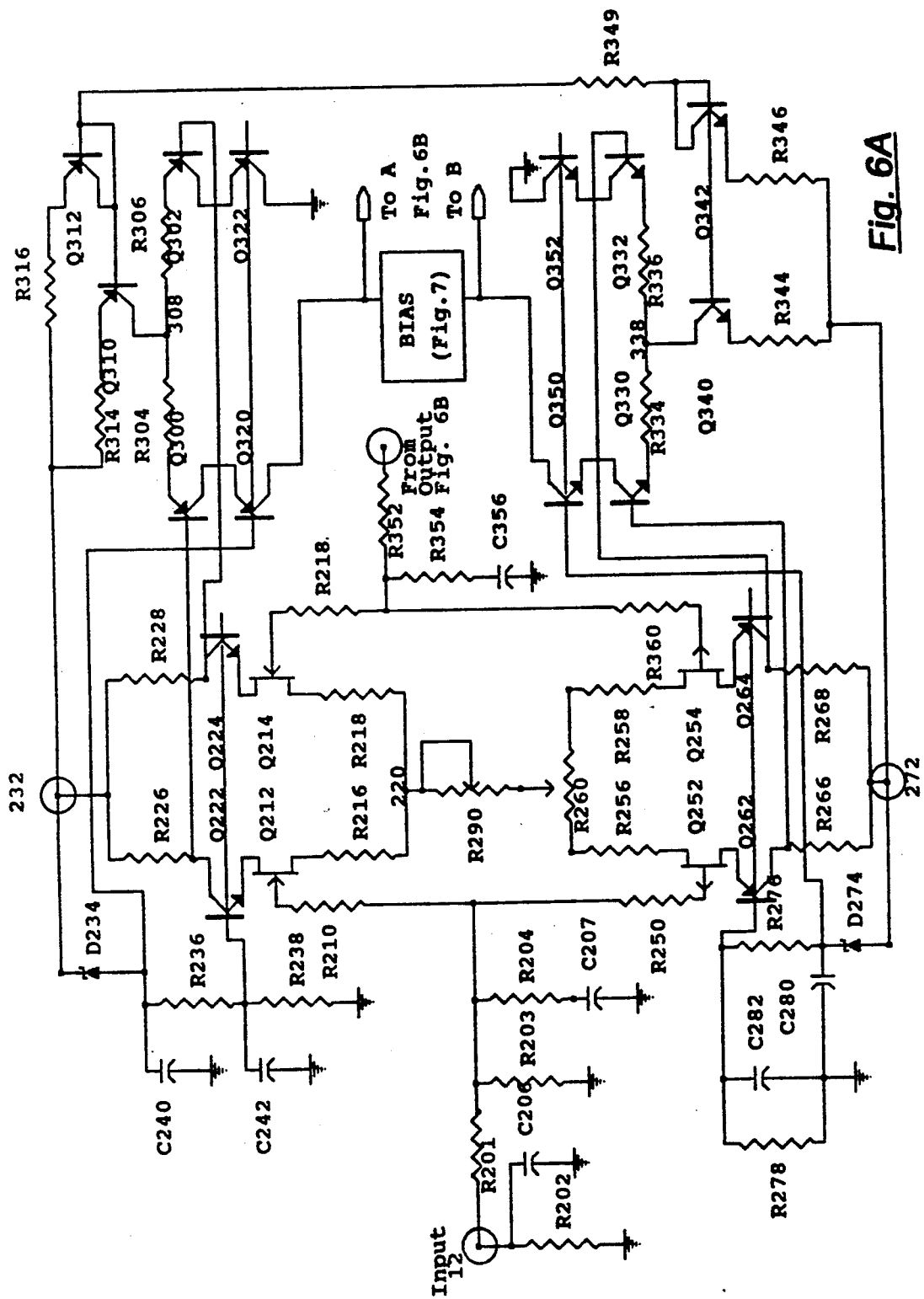
FIGS. 6A and 6B are detailed schematic diagrams illustrating a preferred embodiment of the amplifier design for use with the present invention.
Figure 6B:
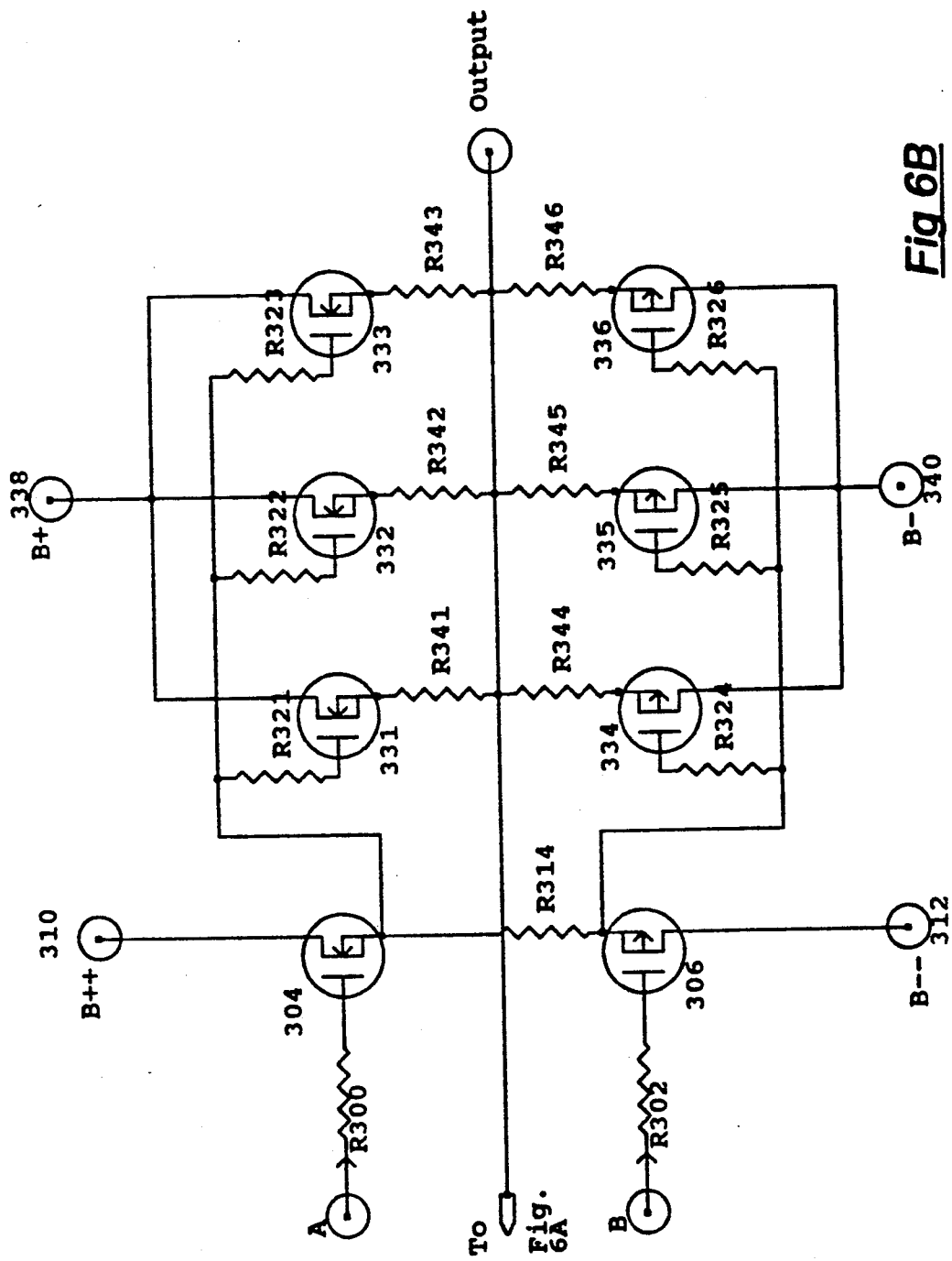

FIGS. 6A and 6B are detailed schematic diagrams of the preferred embodiment of the amplifier for use with the present invention. Here, an input signal to be amplified is applied to an input terminal 12. The input signal is filtered to remove spurious signals in the conventional manner by resistors 201-203 and capacitors 206, 207.

The filtered input signal then passes through a complementary-symmetry, dual differential input stage. Thus, the filtered input signal is passed through a resistor 210 to the gate of the first transistor 212 in a differential N channel JFET pair including a second field effect transistor 214. The JFETs 212, 214 are coupled through source resistors 216, 218 respectively to a common point 220. The drains of JFETs 212, 214 are connected in cascode with a matched pair of NPN transistors 222, 224, respectively. The collector loads on the NPN transistors 222, 224 are comprised of a pair of resistors 226, 228, respectively. The collector resistors 226, 228 connect at a common point 230 to a source of bias voltage 232. The bases of transistors 222, 224 are fixed bias via a divider chain from bias source 232 comprised of Zener diode 234 and series resistors 236, 238. Resistors 236, 238 are bypassed by bypass capacitors 240, 242, respectively.

In a complementary, symmetrical manner, the filtered input signal is coupled through a coupling resistor 250 to the gate of the first transistor 252 in a P channel JEET pair which includes second transistor 254. The drains of transistors 252, 254 connect through source resistors 256, 258, respectively to opposite ends of a potentiometer 260.

The drains of transistors 252, 254 are in cascode with a pair of PNP transistors 262, 264. The collectors of PNP transistors 262, 264 connect through collector load resistors 266, 268, respectively to a common point 270 which connects to a source of negative bias potential 272. The bases of the PNP transistors 262, 264 are fixed biased from a divider chain comprised of Zener diode 274 and series resistors 276 and 278. Resistors 276 and 278 are AC bypassed by corresponding capacitors 280, 282.

Connected between common point 220 and the tap on potentiometer 260 is an input bias level potentiometer 290. In the normal manner, bias current through the input transistors 212, 214, 252 and 254 is controlled by potentiometer 290 whereas total DC offset at the amplifier's output is varied by potentiometer 260.

The differential, amplified output signals across the collector resistors 226, 228 are fed to the bases of PNP transistors 300, 302. Transistors 300, 302 have corresponding emitter resistors 304, 306 which are tied to common point 308. Connected to point 308 is a constant current source comprised of PNP transistors 310, 312 and bias resistors 314, 316. Thus, transistors 300, 302 are operated as true, linear differential amplifiers.

The collectors of PNP transistors 300, 302 are connected in cascode to the emitters of PNP transistors 320, 322. The bases of transistors 320, 322 are fixed bias off of the Zener diode 234. Since only a single ended output is used for the amplifier of FIG. 6A, the collector of cascode transistor 322 is grounded, whereas the collector of transistor 320 is routed both to the bias block 322 (described in detail with respect to FIG. 7) and to the power amplifying circuitry of FIG. 6B.

Similarly, the signals developed across the load resistors 266, 268 are coupled to the basis of the NPN transistors 330, 332, respectively. NPN transistors 330, 332 are provided with emitter resistors 334, 336 which connect at a common point 338. Also connected to common point 338 is the collector of a current source transistor 340. The current source is further comprised of emitter resistor 344 and a current mirror circuit including NPN transistor 342 and emitter resistor 346. The collector and base of transistor 342 are connected in common and through a resistor 349 to the common connection of the collector and base of PNP current mirror transistor 312. In this way, the common current passed through transistors 312, 342 will be mirrored in current source transistors 310, 340 whereby both halves of the dual differential, complementary symmetry pair will pass identical currents.

Since only a single ended output is used for the present amplifier, the collector of cascode transistor 352 is grounded whereas the collector from cascode transistor 350 is passed both to the bias circuit 322 and to the amplification circuitry of FIG. 6B.

Turning now to FIG. 6B, the amplified signals from transistor 320, 350 are coupled through base resistors 300, 302, respectively to the gates of respective driver MOSFET N channel/P channel pair 304, 306, respectively. The drains of drivers 304, 306 connect to positive and negative fixed bias levels 310, 312, respectively. A voltage differential is developed across a resistor 314, the end points of which connect to each of the sources of the driver transistors 304, 306. The signal from the source of driver transistor 304 connects through each of three gate resistors 321-323 to the gates of the N channel power MOSFET output devices 331-333, respectively. Similarly, the signal at the source of driver transistor 306 couples through each of three gate resistors 324-326 to the gates of the P channel MOSFET output devices 334, 336, respectively. The power output transistors 331-336 are operated in the source follower mode, whereby the N channel MOSFET devices 331-333 have their drains connected to a source of positive voltage 338 whereas the drains of the P Channel MOSFET output devices 334-336 connect to a source of negative bias voltage 340. The sources of N channel MOSFET output transistors 331-333 connect through source resistors 341-343, respectively, to the amplifier output terminal 350. Similarly, the sources of the P Channel MOSFET output devices 334-336 each connect through source resistors 344-346, respectively, to the output terminal 350.

Overall gain of the power amplifier is determined by feedback components (FIG. 6A), in the conventional manner, with series feedback resistor 352 and shunt resistor 354. Gain at DC is maintained at 1 via the use of capacitor 356. The feedback signal is then coupled through series resistors 358, 360 to the second input of the differential amplifier transistors 214, 254, respectively.

Figure 7:
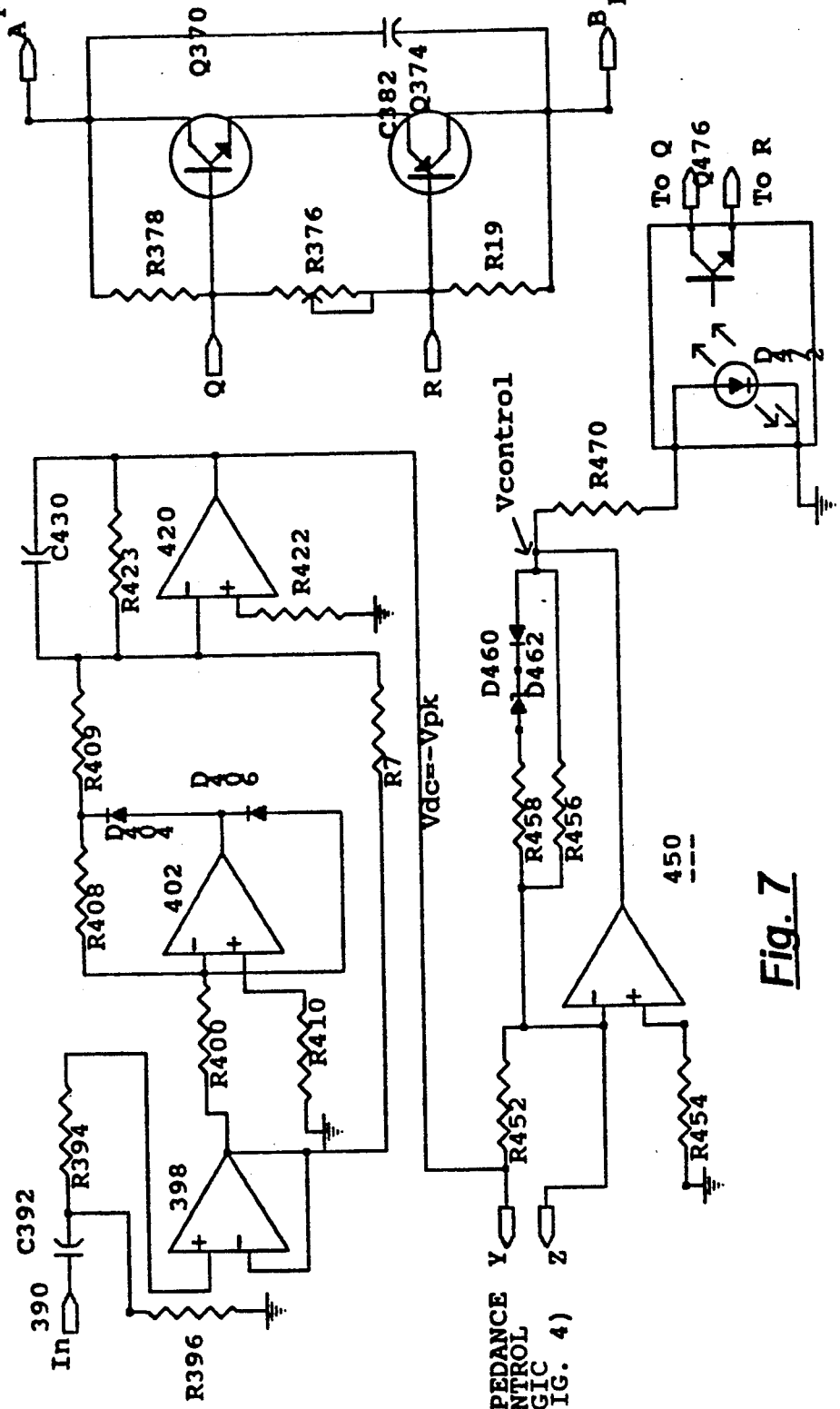
FIG. 7 is a detailed schematic diagram depicting the preferred embodiment of the active bias circuit according to the present invention.

FIG. 7 is a schematic diagram showing the preferred construction of the amplifier bias circuit which incorporates dynamic bias as a function of both input signal level and impedance of the load. Here, shown is a conventional static bias circuit, indicated generally at 370. This circuit is comprised of an NPN transistor 372 which has its emitter connected to the emitter of a complementary PNP transistor 374. The collector of NPN transistor 372 connects to the collector of cascode transistor 310 of FIG. 6A, whereas the collector of PNP transistor 374 connects to the collector of NPN transistor 350 of FIG. 6A.

Connected between the bases of transistors 372, 374 are the ends of a potentiometer 376. Also connected to the base of transistor 374 is the wiper of potentiometer 376. Since the forward voltage drop across the base-emitter junctions of transistors 372, 374 is approximately 1.4 volts, the current through potentiometer 376 can be controlled by means of the setting on the potentiometer's wiper. This same current is then passed through resistors 378 and 380 which are connected across the base-collector terminals of transistors 372, 374, respectively. A bypass capacitor 382 provides an AC bypass for the entire bias circuit. Thus, in the conventional manner, by adjusting the value of potentiometer 376, the voltage across the collectors of bias transistors 372, 374 is varied to thereby vary the bias current in the output transistors shown in 6B.

Dynamic bias to the static bias circuit 370 and, therefore, the power amplifier is accomplished as follows. The input signal to the amplifier is coupled through an input connector 390, input coupling capacitor 392, and resistors 394, 396 to the non-inverting input of an operational amplifier 398. Operational amplifier 398 buffers the input signal and couples it through a resistor 400 to the input of a second operational amplifier 402 which, with associated circuitry comprised of diodes 404, 406 and resistors 408-410 comprise a precision half-wave rectifier 412. The output from half-wave rectifier 412 is coupled with a buffered input signal through resistor 414 to a summer comprised of a third operational amplifier 410 and its associated resistors 422, 423. In the known manner, the half-wave rectified output from rectifier 412 is summed with a buffered input signal to produce a precision full-wave signal at the output of amplifier 420. This signal is in turn integrated with integrating capacitor 430 whereby the output from amplifier 420 is a negative DC signal having a value proportional to the input peak value of the input signal at input 390.

This DC signal is fed to the input of the signal shaper circuit, indicated generally at 450. Circuit 450 is an inverting amplifier, comprised of a series input resistor 452 connected to its inverting input, with a bias resistor 454 connected from its non-inverting input to ground. The transfer characteristic of the signal shaper 450 is determined by the feedback circuit which is comprised of the parallel combination of a resistor 456 and a network comprised of the series connection of a resistor 458, Zener diode 460 and a regular diode 462. The transfer characteristic of circuit 450 realizes graph 142 of FIG. 5A. As such, the output from signal shaper circuit 450 is the desired signal Vcontrol. This signal is passed through the predetermined value series resistor 470 to the light emitting diode input 472 of an opto-coupler 474. Light emitted from the light emitting diode 472 is coupled to the base of the opto-coupler's NPN output transistor 476. The collector and emitter terminals of transistor 476 connect to the base terminals of static bias transistors 372, 374, respectively. Thus, as shown in FIG. 7, the dynamic bias of the amplifier will be maintained in Class A operation for all values of input signal levels.

Changes in the impedance of the load are reflected in the signal shaper circuitry 450 as follows. The gain characteristic of the overall signal shaper circuitry 450 is a function of the value of the series input resistor 452. Thus, in parallel with resistor 452 is the output from the impedance control circuit 104 of FIG. 4. In a manner that will be understood by those of ordinary skill in this art, and referring to FIG. 4, once the impedance of the load has been determined, either through the impedance selector 106 or the automatic impedance determining circuitry, an appropriate value resistance can be connected in parallel with series resistor 452 to effect a desired change in the gain of signal shaper network 450. In the preferred embodiment of the invention, resistor 452 was selected for a load impedance of 8 ohms. Thus, if the impedance control circuit 104 determines that the load impedance is 8 ohms, an infinite value resistance is placed in parallel with resistor 452. If the load impedance is, however, determined to be 6, 4, or 2 ohms, an appropriate value of resistance is placed across terminals Y, Z by impedance control circuit 104 to affect a corresponding gain change through signal shaping circuit 450 to compensate for the corresponding load impedance. In this way, bias of the output stage of the amplifier is adjusted as both a function of input signal level and load impedance to maintain the amplifier in Class A mode of operation.

Figure 8A:
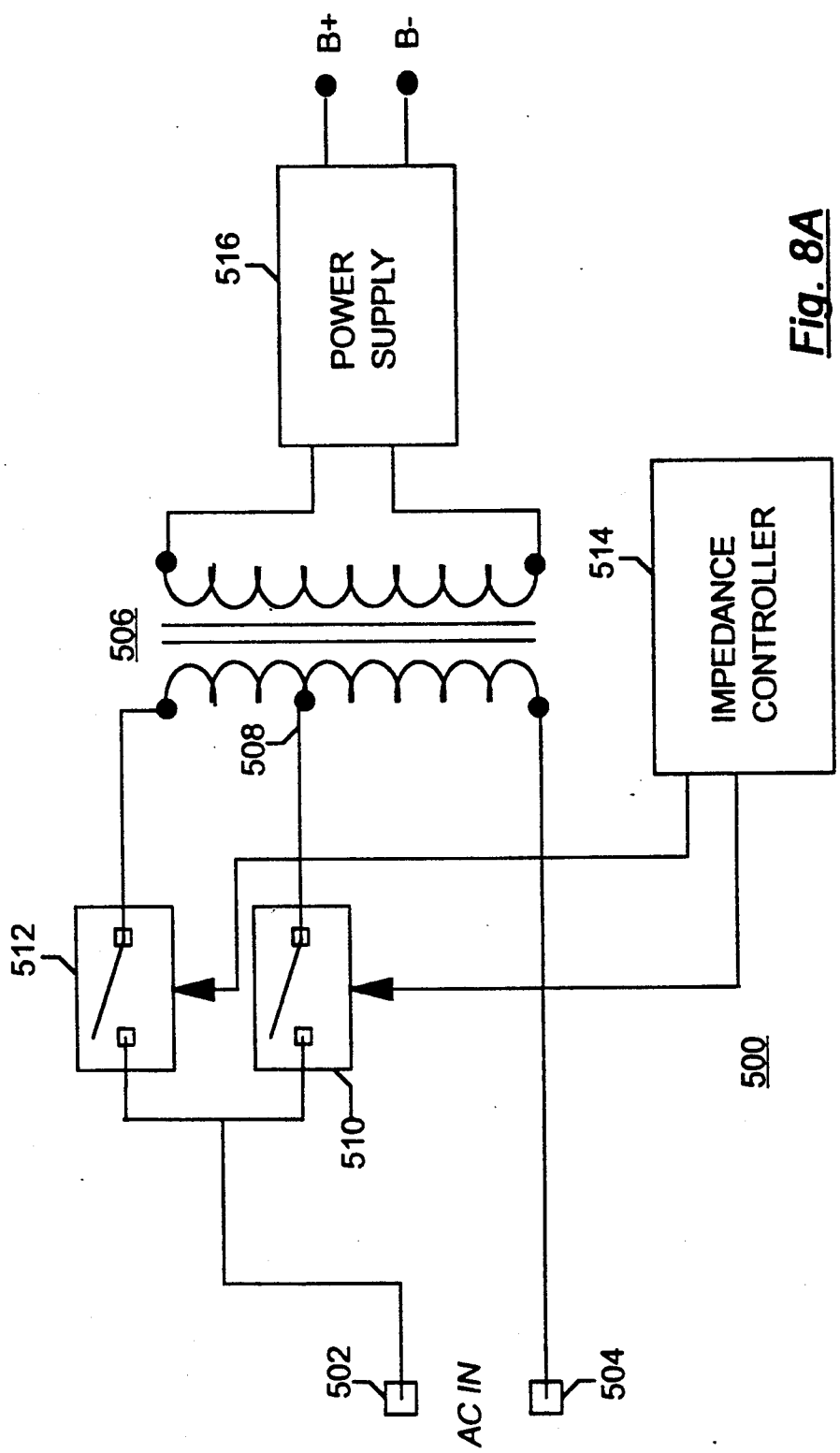
FIGS. 8A and 8B are schematic diagrams illustrating alternate embodiments of the impedance responsive variable voltage bias supply according to the invention.
Figure 8B:
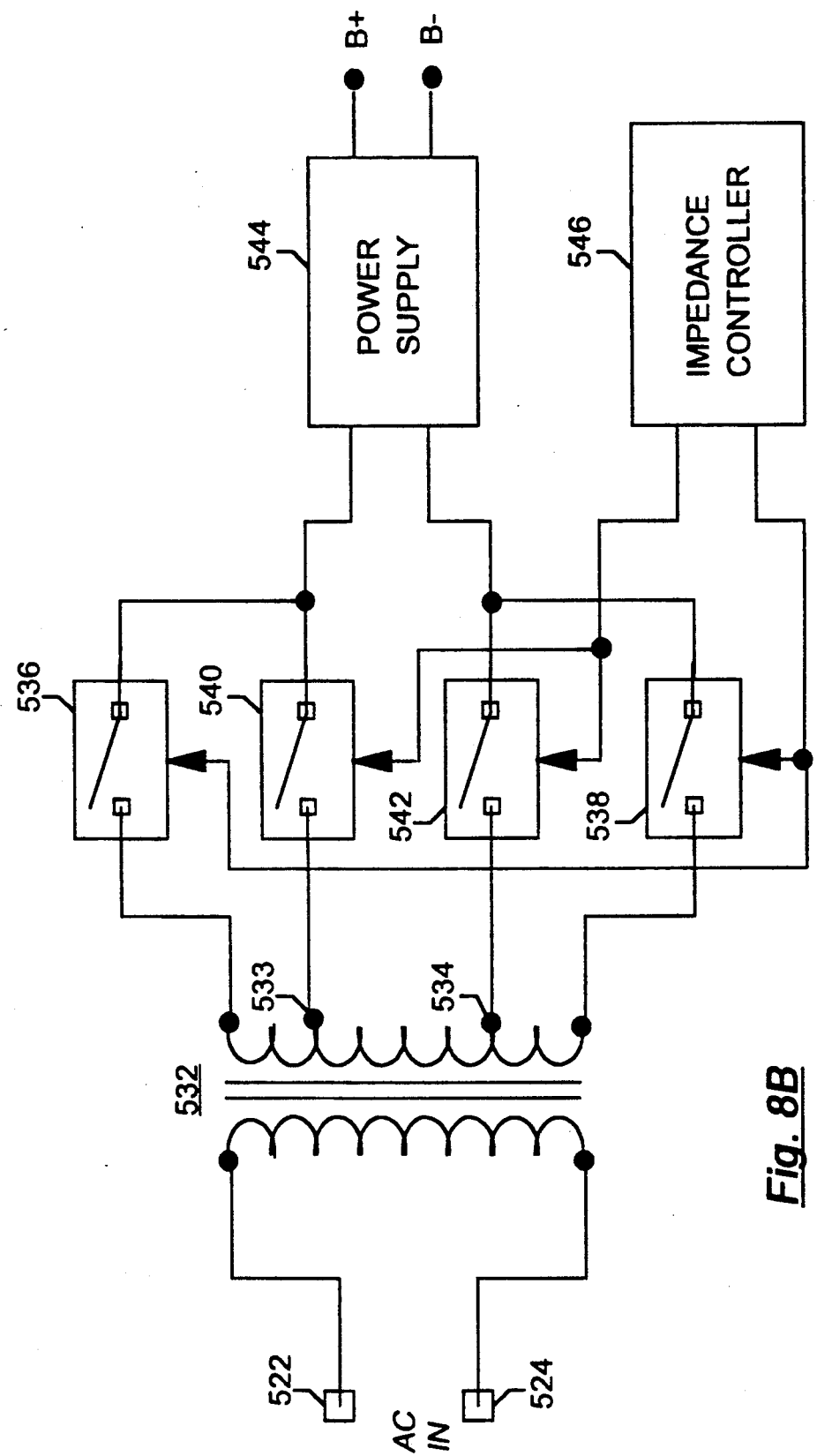

FIGS. 8A and 8B illustrate alternate embodiments of circuit configurations designed to vary the voltage bias levels on the amplifier's output devices in response to the impedance of the load. As described above, if an amplifier is designed to produce the same power rating into both 8 and 2 Ohms, since power equals the square of voltage divided by resistance, the amplifier output swing to produce a given power into 2 Ohms is one-quarter the necessary 8 Ohm swing. This means that if the same bias voltage is applied to the amplifier output devices regardless of load impedance, the output devices will be forced to dissipate four times more power than necessary for a 2 Ohm load. Thus, by varying output device voltage bias levels responsive to the impedance of the load, considerable savings can be realized in the cost, size and reliability of the amplifier.

The circuits of FIGS. 8A and 8B illustrate alternate designs for varying the power supply voltage levels responsive to load impedance. These supplies could be used in the amplifier circuit of FIG. 6B to vary the bias voltage B+ applied at terminal 338 to the N channel output devices 331-333 and the bias voltage B− applied at terminal 340 to the P channel output devices 334-336.

Referring to FIG. 8A, the first alternate power supply is indicated generally at 500. AC mains power is applied at input terminals 502, 504. Input terminal 504 connects to one end of the primary of a power transformer 506. The primary winding of transformer 506 includes a tap 508. Input terminal 502 connects through a relay 510 to the tap 508 and through a second relay 512 to the remaining end of the primary winding. The state of the relays 510, 512 is controlled by an impedance controller 514 (which corresponds to impedance controller 20 of FIG. 1). The secondary winding of transformer 506 connects to conventional power supply circuitry 516, here shown producing the amplifier output device bias voltages B+ and B−.

In operation, the impedance controller 514 responds to the impedance of the load to activate an appropriate one of the relays 510, 512. For example, assuming the amplifier was designed to drive either a 2 or an 8 Ohm load, in the event a 2 Ohm load is present, the impedance controller 514 would activate relay 512 (and deactivate relay 510). This would effectively reduce the turns ratio of transformer 506 and produce lower output voltage bias levels B+ and B−.

If an 8 Ohm load is present, impedance controller 514 would activate only relay 510, thereby effectively increasing the turns ratio of transformer 506 and increasing the values of bias voltages B+ and B−.

With respect to FIG. 8B, here the AC mains power connects to input terminals 522, 524 which, in turn, directly connect to the primary of power transformer 532. Power transformer 532 includes secondary taps 533 and 534. The endpoints of the secondary of transformer 532 connect through relays 536, 538, respectively, to the conventional power supply circuitry 544. The taps 533, 534 of the secondary of transformer 532 connect through relays 540, 542, respectively, to the inputs of power supply 544. Responsive to the impedance of the load, an impedance controller 546 activates either relays 536, 538 or relays 533, 534.

Here, as with the circuit of FIG. 8A, if the impedance controller 546 determines that a low impedance value is present, relays 540 and 542 are activated to effectively reduce the turns ratio of transformer 532, thereby reducing the values of bias voltages B+ and B−. Similarly, if impedance controller 546 determines that a high impedance load is present, relays 536 and 538 are activated, thereby increasing the effective turns ratio of transformer 532 and increasing the bias voltages B+ and B−.

It will be understood that additional transformer taps and relays could be provided in either of the alternate embodiments of FIG. 8A and 8B.

In summary, a dynamic bias amplifier has been described in detail which is capable of varying the amplifier bias level as a function of both input signal level and load impedance to maintain a desired class of amplifier operation. In addition, the amplifier's power supply is responsive to load impedance to appropriately adjust voltage bias on the amplifier's output devices.

While a preferred embodiment of the invention has been described in detail, it should be apparent that many modifications and variations thereto are possible, all of which fall within the true spirit and scope of the invention.

I claim:

1. An amplifier comprising:
   an input adapted to receive an input signal;
   an output adapted to be coupled to a load;
   amplifying means for amplifying an input signal received at said input and coupling said amplified input signal to said output; and
   bias control means including:
   input signal responsive means for producing a first control signal which is predeterminedly related to a received input signal;
   impedance responsive means for producing a second control signal predeterminedly related to the impedance of said load; and
   control means responsive to said first and second control signals for predeterminedly controlling the bias level of said amplifying means.

2. The amplifier of claim 1 wherein said input signal responsive means comprises peak detector means for producing said first control signal responsive to the peak value of an input signal.

3. The amplifier of claim 2 wherein said impedance responsive means comprises:
   means for manually entering an input corresponding to the impedance of said load; and
   means for producing said second control signal responsive to said manually entered input.

4. The amplifier of claim 2 wherein said impedance responsive means comprises:
   automatic test means for automatically producing a signal corresponding to the impedance of said load; and
   means for producing said second control signal responsive to said automatic test means produced signal 5. The amplifier of claim 2 wherein said impedance responsive means comprises:
   selector means for manually entering one of:
   i) an input corresponding to the impedance of a load, or
   ii) an input commanding an automatic test of the impedance of said load;

automatic test means responsive to an input commanding an automatic test of the impedance of said load for producing a signal corresponding to the impedance thereof; and means for producing said second control signal responsive to the selector means selected one of
i) the input corresponding to the impedance of the load, or
ii) the automatic test means produced signal.

6. The amplifier of claim 1 wherein said impedance responsive means comprises:
means for manually entering an input corresponding to the impedance of said load; and
means for producing said second control signal responsive to said manually entered input.

7. The amplifier of claim 6 further comprising:
power supply means for predeterminedly varying the voltage bias on the amplifier's output devices in response to said second control signal.

8. The amplifier of claim 1 wherein said impedance responsive means comprises:
automatic test means for automatically producing a signal corresponding to the impedance of said load; and
means for producing said second control signal responsive to said automatic test means produced signal.

9. The amplifier of claim 8 wherein said automatic test means comprises:
a signal generator for producing a predetermined test signal;
means for coupling said test signal to said load; and
measuring means for measuring the response of said load to said test signal and producing said second control signal responsive thereto.

10. The amplifier of claim 9 wherein:
said signal generator produces a frequency swept, substantially constant current test signal; and
said measuring means comprises:
detector means for producing a signal corresponding to the value of the voltage developed across the load as a result of the test signal,
integrator means for integrating the detector means produced signal, and
processing means for processing said integrator means signal into said second control signal.

11. The amplifier of claim 10 wherein said processing means comprises:
comparator means for comparing said integrator means signal with a set of predetermined reference levels, each reference level corresponding to a predetermined impedance, and
logic means for producing said second control signal responsive to the result of said comparator means comparisons.

12. The amplifier of claim 9 wherein:
said signal generator produces a frequency swept signal; and
said measuring means comprises integrating means for integrating the response of said load to said frequency swept signal.

13. The amplifier of claim 8 further comprising:
power supply means for predeterminedly varying the voltage bias on the amplifier's output devices in response to said second control signal.

14. The amplifier of claim 1 wherein said impedance responsive means comprises:
selector means for manually entering one of:
i) an input corresponding to the impedance of a load, or
ii) an input commanding an automatic test of the impedance of said load;
automatic test means responsive to an input commanding an automatic test of the impedance of said load for producing a signal corresponding to the impedance thereof; and
means for producing said second control signal responsive to the selector means selected one of:
i) the input corresponding to the impedance of the load, or
ii) the automatic test means produced signal.

15. The amplifier of claim 14 wherein said automatic test means comprises:
a signal generator for producing a predetermined test signal;
means for coupling said test signal to said load; and
measuring means for measuring the response of said load to said test signal and producing said second control signal responsive thereto.

16. The amplifier of claim 15 wherein:
said signal generator produces a frequency swept signal; and
said measuring means comprises integrating means for integrating the response of said load to said frequency swept signal.

17. The amplifier of claim 16 wherein:
said signal generator produces a frequency swept, substantially constant current test signal; and
said measuring means comprises:
detector means for producing a signal corresponding to the value of the voltage developed across the load as a result of the test signal,
integrator means for integrating the detector means produced signal, and
processing means for processing said integrator means signal into said second control signal.

18. The amplifier of claim 17 wherein said processing means comprises:
comparator means for comparing said integrator means signal with a set of predetermined reference levels, each reference level corresponding to a predetermined impedance, and
logic means for producing said second control signal responsive to the result of said comparator means comparisons.

19. the amplifier of claim 14 further comprising:
power supply means for predeterminedly varying the voltage bias on the amplifier's output devices in response to said second control signal.

20. The amplifier of claim 1 wherein said control means responds to said first and second control signals to bias said amplifier in substantially a class A mode.

* * * * *